United States Patent [19]

Dishart et al.

[11] Patent Number: 5,011,620

[45] Date of Patent: Apr. 30, 1991

[54] CLEANING COMPOSITION OF DIBASIC ESTER AND HYDROCARBON SOLVENT

[75] Inventors: Kenneth T. Dishart; Mark C. Wolff, both of Wilmington, Del.

[73] Assignee: E. I. Du Pont de Nemours and Company, Wilmington, Del.

[21] Appl. No.: 392,996

[22] Filed: Aug. 7, 1989

[51] Int. Cl.$^5$ .................... C11D 9/30; C11D 15/04; C11D 17/00; C11D 7/50

[52] U.S. Cl. .................... 252/118; 252/117; 252/122; 252/153; 252/170; 252/171; 252/174.22; 252/DIG. 14

[58] Field of Search ............ 252/170, 172, 162, 364, 252/DIG. 8; 134/38, 39, 40

[56] References Cited

U.S. PATENT DOCUMENTS

| | | | |
|---|---|---|---|
| 4,070,303 | 1/1978 | Ohkubo | 252/364 |
| 4,640,719 | 2/1987 | Hayes et al. | 134/40 |
| 4,673,524 | 6/1987 | Dean | 252/118 |
| 4,780,235 | 10/1988 | Jackson | 252/170 |
| 4,867,800 | 9/1989 | Dishart | 134/40 |
| 4,934,391 | 6/1990 | Futch et al. | 134/40 |

OTHER PUBLICATIONS

Du Pont Dibasic Esters Product Bulletin.

*Primary Examiner*—Paul Lieberman
*Assistant Examiner*—Kevin McCarthy

[57] ABSTRACT

A cleaning composition is disclosed which is suitable for cleaning flux residue from a printed circuit board and comprises dibasic ester solvent and a hydrocarbon solvent.

10 Claims, No Drawings

CLEANING COMPOSITION OF DIBASIC ESTER AND HYDROCARBON SOLVENT

BACKGROUND OF THE INVENTION

The present invention relates to a cleaning composition and a method for removal of solder flux from a surface of a substrate and particularly a surface of a printed circuit board.

Prior to a soldering operation for attachment of components to printed circuit boards it is conventional and essential to apply a soldering flux to insure an adherent bond of solder. The printed circuit board may be protected with a solder mask which covers all areas of the substrate except where solder is to contact and adhere to a conductive surface portion. Application of flux and solder can be done by hand, wave or reflow methods. In wave soldering the substrate is mechanically conveyed over and contacted with the flux and then with a molten solder wave. The solder adheres to all conductive surfaces on the substrate except where solder mask is present. In reflow soldering a solder paste, containing both flux and solder metal in powder form, is applied only to the points where solder bonds are to be made. Components are set in place and the entire printed circuit board assembly is heated to melt the solder. Flux which remains on the assembly after soldering can cause premature failure of the electrical circuitry through corrosion, absorption of water and other effects and must be removed.

In Hayes et al. U.S. Pat. 4,640,719 use of terpene compounds is disclosed in cleaning printed wiring boards. This patent discloses cleaning of residual flux and particularly rosin solder flux and adhesive tape residues employing terpene compounds such as pinene including its alpha and beta isomer, gamma terpinene, delta-3-carene, limonene and dipentene with limonene and dipentene preferred. Dipentene is the racemic mixture of the limonene optically active isomers. This patent further discloses that these terpene compounds are almost completely insoluble in water and cannot be directly flushed away by water. Therefore in a preferred embodiment terpene compounds are combined with one or more emulsifying surfactants capable of emulsifying terpenes with water to facilitate their removal.

SUMMARY OF THE INVENTION

The present invention is directed to a cleaning composition comprising (a) a dibasic ester and (b) a hydrocarbon solvent and the use of such composition in reducing residues on a surface of a substrate such as a printed circuit board.

DETAILED DESCRIPTION OF THE INVENTION

The cleaning composition of the present invention can be employed upon any substrate surface particularly one to which residual excess flux is present such as after a solder operation. A preferred substrate surface is a printed circuit board surface which may or may not be protected by a solder mask permanent coating in areas where solder is not to adhere. In the present disclosure printed circuit board is employed in a generic sense and is inclusive of printed wiring boards.

In the present invention a combination of a dibasic ester solvent is employed with a hydrocarbon solvent and this combination is considered to be a replacement over the use of chlorofluorocarbon (CFC) solvents which are presently employed as cleaning agents with particular suitability in cleaning printed circuit boards. An azeotrope of trichlorotrifluoroethane and methanol such as sold under the trademark Freon TMS by E. I. du Pont de Nemours and Company is superior to known methods of cleaning solder flux from a surface of a printed wiring board. However the use of fully halogenated chlorofluorocarbon materials are considered to present a threat to the environment because of their involvement in stratospheric ozone depletion. Therefore any improvement in alternative cleaning compositions which do not contain a fully halogenated CFC is considered significant. In accordance with the present invention residual ionic contaminants are reduced to low levels (even though such levels may be somewhat higher than cleaning with a fully halogenated CFC methanol azeotrope). However the results herein are considered to be a significant improvement compared to use of other cleaning agents including use of a terpene compound in combination with an emulsifying agent.

In accordance with the present invention a dibasic ester or combination of dibasic ester solvents is employed. Dibasic ester is employed in its normal definition and include typical dialkyl esters of dicarboxylic acids (dibasic acids) capable of undergoing reactions of the ester group, such as hydrolysis and saponification. Conventionally at low and high pH they can be hydrolyzed to their corresponding alcohols and dibasic acids or acid salts. Preferred dibasic ester solvents are: dimethyl adipate, dimethyl gluterate and dimethyl succinate and mixtures thereof. Other esters with longer chain alkyl groups derived from alcohols, such as ethyl, propyl, isopropyl, butyl and amyl and mixtures thereof including methyl can be employed. Also the acid portion of these esters can be derived from other lower and higher molecular weight dibasic acids, such as oxalic, malonic, pimelic, suberic, and azelaic acids and mixtures thereof including the preferred dibasic acids. These and other esters can be employed provided they are at least partially soluble with the hydrocarbon solvent and are not classified as flammable liquids (Flash Point at or above 100° F. by Tag Closed Cup method) and have at least 2.0 wt% solubility in water at 25° C. Additionally a compatibilizing component may be added to improve the mutual solubility of the dibasic ester and hydrocarbon solvent.

In the present invention one or more hydrocarbon components are used in combination with the dibasic ester solvent. The type of hydrocarbon component useful in the invention is not critical for the cleaning effectiveness and may be selected from the broad class of aliphatic and aromatic solvents. Preferred hydrocarbon compounds or blends thereof would not be classified as flammable liquids (Flash Point at or above 100° F. by Tag Closed Cup method) and would have solubility parameter ranges for, nonpolar of 6.5 to 10.5, for polar of 0 to 2.5 and hydrogen bonding of 0 to 2.5 based on the three dimensional Hansen Solubility Parameter System with units of the square root of calories per cubic centimeter. More preferred are the above hydrocarbon compounds or blends thereof with Flash Points of 140° F. or higher. Examples of such hydrocarbon components are the high flash point petroleum derived solvents, such as mineral spirits, naphthas, and aromatics readily available from a variety of suppliers. Specific examples are Exxon "Isopar," Shell "Soltrol" and Ashland "Hi-Sol" solvents. In the present disclosure the use of the term "hydrocarbon solvent" expressly excludes a terpene hydrocarbon.

The concentration or ratio of dibasic ester to hydrocarbon solvent is not considered critical and the percentage of these two components can vary with wide ranges such as 5 to 25% dibasic ester and conventionally from 75 to 95% hydrocarbon on the basis of the weight percent of these two components only.

Additionally if a combination of esters is employed the respective amounts are not considered critical and commercially available mixtures may be directly utilized.

An important criteria in the present invention is a reduction of ionic contamination due to cleaning with a combination of a dibasic ester and hydrocarbon solvent. A preferred substrate for cleaning is a printed circuit board and more particularly a printed circuit board contaminated with rosin flux after a soldering operation. A need for cleanliness on surfaces of the board becomes essential due to defects which can result either at the time of manufacture or subsequently in use of such printed circuit boards. For example corrosion of the circuit board can occur due to contamination from an activated rosin flux.

In the cleaning operation the method of contact of the dibasic ester and hydrocarbon solvent combination is not critical. A preferred method of application of the cleaning composition is by spraying but other conventional contact operations can be employed including a dipping process. Elevated temperature of the cleaning composition is feasible such as a temperature up to 90°°C. but room temperature material may be directly applied.

After application of the liquid preferably the substrate is rinsed with water such as deionized water. The rinse water may be heated to facilitate the rinsing efficiency.

To illustrate the present invention the following examples are provided.

EXAMPLE 1

Three hydrocarbon solvent compositions were compared for cleaning efficiency in removal of ionic contamination residues from printed wiring boards (PWBs) using a two-step cleaning process of solvent contact followed by water rinsing.

Solvent 1 was a composition containing terpene hydrocarbons, principally dipentene, with an emulsifying surfactant and was the product tradenamed "Bioact" EC-7 sold by the Petroferm Company. Such composition contains a small amount of water, i.e., less than 1% by weight.

Solvent 2 and Solvent 3 had compositions in accordance with the teachings of the present invention differing only in the hydrocarbon component and which contained:

| Component | Approximate Wt. % |
|---|---|
| High Flash Hydrocarbon Solvent | 75 |
| Dibasic Esters | 15 |
| Du Pont Merpol SE Surfactant | 10 |

(Merpol SE Surfactant contained about 4% by weight water)

The hydrocarbon portion of Solvent 2 was a petroleum distillate with a boiling range of 350° F. to 379° F. and was a mixture of 85% cycloparaffins, 14% isoparaffins and 1% n-paraffins by weight with aromatic hydrocarbon content less than 0.05 wt%. Its flash point was 127° F. and it had a low, non-objectionable odor and low toxicity.

The hydrocarbon portion of Solvent 3 was also a petroleum distillate product but with a boiling point range of 400° F. to 441° F. and flash point of 159° F. It was a mixture of 69% cycloparaffins, 29% isoparaffins and 2% n-paraffins by weight with aromatic content less than 0.01 wt%. It also had a low nonobjectionable odor and low toxicity.

The dibasic esters were a mixed dimethyl esters of adipic, glutaric and succinic acids with limited solubility of less than 10% by weight in the hydrocarbon but the surfactant component in the formulation enhances the miscibility. The dibasic ester and surfactant components had flash points of 212° F. and 199° F., respectively.

PWBs employed in this example were single-sided patterns with 704 holes. Each PWB measured approximately 28.0 square inches. Circuit patterns were constructed of copper covered with fused tin/lead alloy.

All PWBs were soldered on an Electrovert Econopak II wave soldering machine with a 6 feet per minute belt speed and a 500° C. preheater setting to give an approximate 85° C. PWB top temperature prior to soldering with a 63/37 by weight eutectic tin/lead solder wave maintained at 250° C. The solder flux applied with a brush prior to the preheat and soldering operation was a commonly used rosin, mildly activated flux (Alpha 611F).

Sets of five printed wiring boards, soldered as described above, were cleaned with each solvent. The boards were sprayed individually with the solvent for 4 minutes using 50 psi. Excess liquid solvent was removed by blowing with compressed air and then the boards were rinsed with water in a 4 stage commercial water cleaner. Rinse time totaled 5 minutes with water temperature maintained at 55° C.

Residual ionic contamination was measured according to military specification method MIL-P-28809 in an "Omega Meter" 600. 2500 ml of 75 weight % isopropyl alcohol and 25 weight % water was used in a 15 minute test. Individual readings were made for each cleaned PWB. The average result for each solvent and the computed standard deviations and variance are shown below.

|  | Average Residual Ionic Contamination, Micrograms NaCl Equivalents/Sq. Inch | Standard Deviation | Variance |
|---|---|---|---|
| 1. Solvent 1 | 13.6 | 0.63 | 0.40 |
| 2. Solvent 2 | 5.4 | 0.43 | 0.19 |
| 3. Solvent 3 | 7.6 | 1.20 | 1.40 |

These results demonstrate significantly improved cleaning efficiency due to lower ionic residue remaining on the substrate cleaned in Solvents 2 and 3 in comparison with solvent 1 which contained terpene hydrocarbons (and an emulsifying surfactant).

EXAMPLE 2

Another composition was prepared for comparison with the compositions described in Example 1. Solvent 4 was a composition in accordance with the teachings of the present invention and it contained:

| Component | Approximate Wt. % |
| --- | --- |
| High Flash Hydrocarbon Solvent | 92.5 |
| Dibasic Esters | 7.5 |

The hydrocarbon component was the petroleum distillate product used in the solvent 2 composition of Example 1 with the distillation range of 350° F. to 379° F. and Flash Point of 127° F.

All PWBs were soldered, cleaned and tested for ionic contamination in accordance with the procedures described in Example 1. The results of the ionic contamination tests are shown below.

|  | Average Residual Ionic Contamination, Micrograms NaCl Equivalents/Sq. Inch | Standard Deviation | Variance |
| --- | --- | --- | --- |
| 4. Solvent 4 | 6.3 | 1.3 | 1.8 |

These results demonstrate that high cleaning efficiency can be achieved when using no emulsifying surfactant.

What is claimed is:

1. A cleaning composition designed for cleaning a printed circuit board consisting essentially of (1) a dibasic ester, (b) an aliphatic hydrocarbon solvent wherein the term hydrocarbon solvent excludes a terpene wherein a ratio of dibasic ester to hydrocarbon solvent is in a range from 5:95 to 25:75 by weight.

2. The cleaning composition of claim 1 wherein the dibasic ester solvent is a dimethyl ester.

3. The cleaning composition of claim 1 wherein the dimethyl ester solvent is dimethyl adipate, dimethyl glutarate, dimethyl succinate or combination thereof.

4. The cleaning composition of claim 1 wherein a combination of dimethyl ester solvents is employed.

5. A process for reducing residues from a surface of a substrate comprising contacting the surface with a cleaning composition designed for cleaning a printed circuit board consisting essentially of (a) a dibasic ester solvent, (b) an aliphatic hydrocarbon solvent wherein the term hydrocarbon solvent excludes a terpene wherein a ratio of dibasic ester to hydrocarbon solvent is in a range from 5:95 to 25:75 by weight.

6. The process of claim 5 wherein the substrate comprises a printed circuit board.

7. The process of claim 6 wherein the printed circuit board contains solder flux residue.

8. The process of claim 5 wherein the dibasic ester solvent is a dimethyl ester.

9. The process of claim 8 wherein the dimethyl ester solvent is dimethyl adipate, dimethyl glutarate dimethyl succinate or combination thereof.

10. The process of claim 5 wherein a combination of dimethyl ester solvents is employed.

* * * * *